United States Patent
Katoh

(10) Patent No.: US 6,492,914 B2
(45) Date of Patent: Dec. 10, 2002

(54) FILTER-PROVIDED DEVICE

(75) Inventor: Nobuhiro Katoh, Nara (JP)

(73) Assignee: Sharp Kabushiki Kaisha

( * ) Notice: Subject to any disclaimer, the term of this patent is extended or adjusted under 35 U.S.C. 154(b) by 0 days.

(21) Appl. No.: 09/984,397

(22) Filed: Oct. 30, 2001

(65) Prior Publication Data

US 2002/0113725 A1 Aug. 22, 2002

(30) Foreign Application Priority Data

Dec. 26, 2000 (JP) ........................................ 2000-395821

(51) Int. Cl.[7] ................................................ H03M 1/12
(52) U.S. Cl. .......................................... 341/50; 341/155
(58) Field of Search ........................... 341/50, 155, 118, 341/120, 143, 126, 139

(56) References Cited

U.S. PATENT DOCUMENTS 6,369,741 B1 * 4/2002 Demichel .................... 341/155
6,400,214 B1 * 6/2002 Aram .......................... 341/155

FOREIGN PATENT DOCUMENTS

JP 10-257108 A 9/1998

* cited by examiner

*Primary Examiner*—Brian Young
(74) *Attorney, Agent, or Firm*—Birch, Stewart, Kolasch & Birch, LLP

(57) ABSTRACT

In the high-frequency receiving device, a frequency dividing circuit of ×1/N divides a sampling clock signal of both A/D converters by the dividing ratio based on a controlling signal outputted from a controlling signal generator, and generates a constant current reference signal whose frequency is equal to a cut-off frequency of a low-pass filter which is to be set. Based on the constant current reference signal, a phase shift circuit, a mixer, a low-pass filter, a DC amplification circuit, and a constant current source perform loop back control so that an output of the mixer is 0, and input an output signal of the DC amplifying circuit as the output signal of a controlling circuit to a constant current source. Thus, the constant current source does not adjust the scale factor, so that a current according to the cut-off frequency which is to be set is inputted to the low-pass filter. As a result, it is possible to provide a filter-provided device in which a frequency value indicative of a passing frequency characteristic can be set so accurately.

21 Claims, 5 Drawing Sheets

FILTER-PROVIDED DEVICE

FIELD OF THE INVENTION

The present invention relates to a filter-provided device with a filter in which a frequency value indicative of a passing frequency characteristic is set according to a value of a current inputted as a controlling signal, and specifically to a filter-provided device which is suitable for controlling a cut-off frequency of a low-pass filter of a high-frequency receiving device which receives a digital signal and demodulates the received digital signal.

BACKGROUND OF THE INVENTION

Conventionally, a filter-provided device with a filter in which a frequency value indicative of a passing frequency characteristic is set according to a value of a current inputted as a controlling signal includes a high-frequency receiving device which is used in a tuner of a satellite broadcast etc. FIG. 5 is a circuit block diagram schematically showing a structure of a conventional high-frequency receiving device 100, and describes a case where the filter is a low-pass filter, and the frequency value indicative of the passing frequency characteristic is a cut-off frequency. In the high-frequency receiving device 100 of FIG. 5, when a high-frequency signal which is subject to a digital modulation is inputted, an amplifying circuit 102 amplifies a received signal, and further, an amplifying circuit 103 amplifies an output signal of the amplifying circuit 102 at a controlled gain. Next, the output signal of the amplifying circuit 103 is inputted to frequency changing circuits 104 and 105, and the frequency changing circuits 104 and 105 mix the signal inputted from the amplifying circuit 103 and a signal inputted from a phase shifting circuit 106, and outputs a base band signal.

Further, a PLL (Phase Locked Loop) circuit 108 to which a controlling signal S1 for determining a dividing ratio is inputted, controls a phase of a local oscillating signal which is generated in a local oscillating circuit 107, and is almost equal to a center frequency of a received frequency, based on a reference frequency signal generated in a reference signal oscillator 109, and the local oscillating signal of the local oscillating circuit 107 is inputted to the phase shifting circuit 106. The phase shifting circuit 106 generates a signal whose phase is shifted 90° with respect to the local oscillating signal, and inputs the local oscillating signal of the original phase to one of the frequency changing circuits 104 and 105, and inputs the 90° shifted signal to the other.

The output signals of the frequency changing circuits 104 and 105 are inputted to low-pass filters 110 and 111 respectively, and the low-pass filters 110 and 111 remove a high-frequency component of the inputted signals. The output signals of the low-pass filters 110 and 111 are inputted to AGC (Automatic Gain Control) amplifiers 112 and 113 respectively, and the AGC amplifiers 112 and 113 amplify the inputted signals at a controlled gain. The output signals of the AGC amplifiers 112 and 113 are inputted to low-pass filters 114 and 115 respectively, and the low-pass filters 114 and 115 remove interfering signals of adjacent channels or noise from the inputted signals at a cut-off frequency controlled by a controlling circuit 130 described later. The output signals of the low-pass filters 114 and 115 are inputted to A/D converters 118 and 119 after being amplified by amplifying circuits 116 and 117. The A/D converters 118 and 119 convert analog signals to digital signals so as to perform a demodulating process in a demodulating circuit 120 described later. The output signals of the A/D converters 118 and 119 are inputted to a demodulating circuit 120, and the demodulating circuit 120 demodulates the input signals which are subject to a digital modulation, and outputs a transport signal TS.

Further, a PLL circuit 122 to which a controlling signal S2 for determining the dividing ratio is inputted controls a phase of a local oscillating signal of a predetermined frequency which is generated in a local oscillating circuit 121, based on a reference frequency signal generated in a reference signal oscillator 123, and the local oscillating signal whose phase is controlled is inputted to the A/D converters 118 and 119 and the demodulating circuit 120. The A/D converters 118 and 119 and the demodulating circuit 120 are operated in accordance with the local oscillating signal as an operating signal. The operating signal becomes a sampling clock signal with respect to the A/D converters 118 and 119.

The low-pass filters 114 and 115 remove interfering signals of adjacent channels or noise, and function as an anti-aliasing of the A/D converters 118 and 119. The input signal has the modulating rate of several megabaud to dozens of megabaud. Thus, in order to make the low-pass filters 114 and 115 function effectively, it is required to set a cut-off frequency not to a fixed value, but to a suitable value according to the baud rate of the input signal. Further, when a cut-off frequency setting circuit is made up of a resistance and a capacitor in a circuit in an IC (Integrated Circuit), a variation of an IC process brings about a variation of the cut-off frequency of ±15% to ±20%. Thus, in a controlling circuit 130 shown in FIG. 5, a constant current source 137 is formed, and cut-off frequencies of the low-pass filters 114 and 115 are set by varying a constant current outputted from the constant current source 137 by the controlling circuit 131. In the constant current source 137, a signal generated based on a reference frequency signal which was generated in a reference signal oscillator 124 such as a crystal oscillator and has an accurate frequency (4 MHz in FIG. 5) is used as an input signal.

A circuit for generating the input signal of the constant current source 137 is a loop which includes a phase shift circuit 132, a mixer 133, a low-pass filter 134, a DC amplifying circuit 135, and a constant current source 136. The phase shift circuit 132 brings 90° shift to a phase of a reference frequency signal inputted from the reference signal oscillator 124. The signal whose phase is shifted 90° and the reference frequency signal outputted from the reference signal oscillator 124 are inputted to the mixer 133. The mixer 133 performs multiplication of the both signals, and the low-pass filter 134 removes a high-frequency component of an output signal of the mixer 133. Further, a DC amplifying circuit 135 amplifies an output signal of the low-pass filter 134. An output signal of the DC amplifying circuit 135 is inputted to the constant current sources 136 and 137, and the constant current sources 136 and 137 vary a current value based on the output current 135. A constant current of the constant current source 136 is inputted to the phase shift circuit 132, and the loop performs a control so that an output signal of the mixer 133 $MIX_{out}=0$. Thus, the constant current sources 136 and 137 output constant currents according to a frequency of the reference frequency signal (4 MHz in FIG. 5).

The controlling circuit 131 includes a switch circuit based on a current mirror circuit, and is switched based on a controlling signal S3 which is inputted from outside according to a desired frequency, and adjusts a value of the constant current outputted from the constant current source 137 to a value according to a target cut-off frequency of the low-pass filters 114 and 115. An adjusting ratio is determined by the controlling signal S3, and is arbitrary. Further, a current outputted from the controlling circuit 131 is inputted as a controlling signal for controlling the cut-off frequency to the low-pass filters 114 and 115 respectively.

The low-pass filters 114 and 115 whose cut-off frequencies are controlled by the current outputted from the controlling circuit 130 arranged in this way are realized with a gm•C filter made up of a transconductance amplifier (hereinbelow referred to as gm amplifier) and a capacitor, and a constant current controlling circuit. The phase shift circuit 132 of the controlling circuit 130 is a low-pass filter using the same type gm•C filter as the low-pass filters 114 and 115, and the cut-off frequency is controlled by a master-slave system.

The controlling system of the cut-off frequency described above is generally used in a receiver which is arranged so that a current inputted to a transconductor circuit is varied by using a variable current source. The receiver is disclosed in Japanese Unexamined Patent Publication No. 257108/1998 (Tokukaihei 10-257108)(publication date: Sep. 25, 1998).

However, the switch circuit which makes up the controlling circuit 131 for controlling the cut-off frequencies of the low-pass filters 114 and 115 includes a large number of current mirror circuits and MOS-FETs. Thus, when a value of a constant current outputted from the constant current source 137 is adjusted to a value for the target cut-off frequency, a variation of an element characteristic and a current amplification factor hFE cause a large error between a current value and the target value. Also when a constant current of the constant current source 137 is multiplied equally by the controlling circuit 131, a signal passes via the switch circuit, so that the error is large. Especially, when a difference between a frequency of the reference frequency signal outputted from the reference signal oscillator 124 and the cut-off frequency is large, a signal passes via more circuits in the controlling circuit 131, so that an error of the current value becomes large. Thus, even when the cut-off frequency is controlled from outside of the low-pass filters 114 and 115, it is still impossible to set the cut-off frequency so accurately.

Further, in order to set the cut-off frequency so accurately, it is required to enlarge the size of a current switch circuit which controls the constant current source of the controlling circuit 131, so that power consumption is increased.

In controlling a cut-off frequency of a high-pass filter and a center frequency in a passband of a band pass filter, the foregoing problems can be brought about.

SUMMARY OF THE INVENTION

The object of the present invention is to provide a filter-provided device in which a frequency value indicative of a passing frequency characteristic, such as a cut-off frequency of a low-pass filter and of a high-pass filter and a center frequency of a pass band of a band pass filter, is set so accurately, and to provide a setting method of the passing frequency characteristic of the filter. Further, another object is to provide a filter-provided device which can reduce power consumption by a simple structure with the frequency value capable of being set so accurately, and to provide a setting method of the passing frequency characteristic of the filter.

The filter-provided device of the present invention, in order to achieve the foregoing objects, includes a filter whose frequency value indicative of a passing frequency characteristic is set according to a value of a current inputted as a controlling signal; a constant current source for inputting the current to the filter; a constant current controlling section for controlling the constant current source so as to output the current whose value corresponds to the frequency value indicative of the passing frequency characteristic which is set by the constant current source.

According to the structure, the constant current source controlling section controls the constant current source so that a current according to the frequency value indicative of the passing frequency characteristic which is to be set, such as a cut-off frequency of a low-pass filter, is outputted. The current outputted from the constant current source without performing a scale factor adjustment is inputted directly to the filter as a controlling signal, and the frequency value indicative of the passing frequency characteristic of the filter is set to a desired value. The scale factor adjustment of the value of the current is not performed, so that it is not required to provide a switch circuit for performing the scale factor adjustment. Thus, an error of a current value inputted to the filter is suppressed.

As a result, it is possible to provide the filter-provided device in which the frequency value indicative of the passing frequency characteristic of the filter can be set so accurately.

Further, besides the foregoing structure, in a case where an analog to digital converting section for converting an analog signal to a digital signal, and a sampling clock signal generating section for generating a sampling clock signal of the analog to digital converting section are provided, it is preferable that the constant current source controlling section generates a constant current reference signal including information of the frequency value indicative of the passing frequency characteristic based on the sampling clock signal, and controls the constant current source based on the constant current reference signal.

According to the structure, the constant current source controlling section generates the constant current reference signal including information of the frequency value indicative of the passing frequency characteristic of the filter based on the sampling clock signal generated by an existing sampling clock signal generating section, and controls the constant current source based on the constant current reference signal, so that it is possible to provide the filter-provided device which can reduce power consumption by a simple structure with the frequency value which indicates the passing frequency characteristic capable of being set so accurately.

Further, in a case where a signal processed by the filter is a small signal of a modulated rate, and the small signal is converted from an analog signal to a digital signal by the analog to digital converting section, it is possible to reduce the frequency of the sampling clock signal, so that power consumption can be reduced with the frequency reduced.

Further, besides the foregoing structure, it is preferable that the constant current source controlling section includes a frequency converting section for generating the constant current reference signal whose frequency is equal to the frequency value indicative of the passing frequency characteristic to be set, based on the sampling clock signal.

According to the structure, the constant current source controlling section equalizes the frequency of the constant current reference signal to the frequency value indicative of the passing frequency characteristic so as to include the frequency value indicative of the passing frequency characteristic in the constant current reference signal, and performs a control based on this, so that a current which corresponds to the frequency value indicative of the passing frequency characteristic is outputted. This enables the current of the constant current source to easily have a value according to the frequency value indicative of the passing frequency characteristic which is to be set.

Further, the filter-provided device according to another preferable embodiment of the present invention, in order to achieve the foregoing objects, includes a constant current reference signal generating section for varying the frequency of the constant current reference signal according to the frequency value indicative of the passing frequency characteristic which should be set; a constant current generating section which performs frequency to current conversion and outputs the constant current whose value corresponds to the frequency of the constant current reference signal; and a filter for controlling the passing frequency characteristic according to the value of the constant current.

According to the structure, the frequency to current conversion is performed with respect to the constant current reference signal whose frequency corresponds to the passing frequency characteristic which should be set, so that the constant current applied to the filter is generated. Thus, the constant current of the constant current generating section is inputted directly to the filter, unlike a structure in which the current is amplified at a scale factor according to the passing frequency characteristic to be set after generating a constant current whose current value is fixed.

Further, unlike a structure in which after judging what passing frequency characteristic should be set, the constant current is generated based on the judging result, it is possible to improve accuracy of the value of the constant current generated by the constant current generating section easily, even in a case where the frequency value indicative of the passing frequency characteristic is varied widely. Note that, it is possible to vary the frequency of the constant current reference signal generating section, for example by frequency dividing etc., more widely, and more accurately.

As a result, it is possible to set the constant current so that the value of the constant current corresponds to the frequency value accurately and easily, and to provide the filter-provided device which can set the frequency value indicative of the passing frequency characteristic of the filter so accurately.

Further, in a case where the filter-provided device includes an analog to digital converter for converting an analog signal which passed through the filter to a digital signal, it is preferable that the constant current reference signal generating section includes a sampling clock signal generating section for generating a sampling clock signal indicative of a sampling point of the analog to digital converter, and a signal generating section for generating the constant current reference signal based on the sampling clock signal.

According to the structure, since the constant current reference signal is generated based on the sampling clock signal, it is not required to provide another oscillator besides an oscillator for generating the sampling clock signal, when the constant current reference signal whose frequency corresponds to the frequency value which should be set is generated, so that it is possible to simplify the circuit structure.

For a fuller understanding of the nature and advantages of the invention, reference should be made to the ensuing detailed description taken in conjunction with the accompanying drawings.

DESCRIPTION OF THE EMBODIMENT

One embodiment which realizes a filter-provided device of the present invention is described as follows based on FIG. 1 to FIG. 4. Note that, the following is, as an example, a description of a case where the filter-provided device is a high-frequency receiving device suitably used in a tuner of a satellite broadcast etc., and the filter is a low-pass filter, and a frequency value indicative of a passing frequency characteristic is a cut-off frequency.

Figure 1:
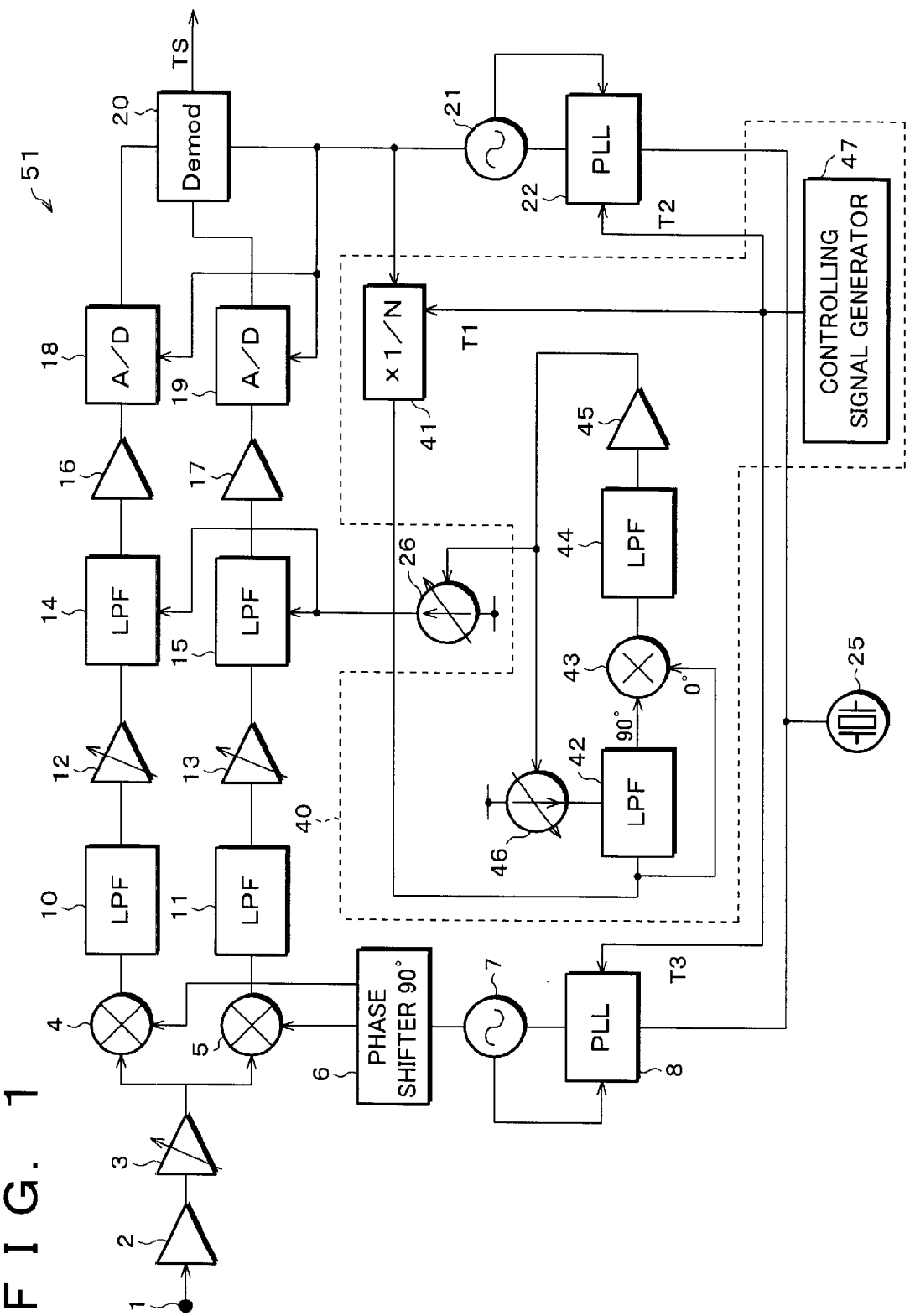
FIG. 1 is a circuit block diagram showing a structure of a filter-provided device according to one embodiment of the present invention.
Figure 2:
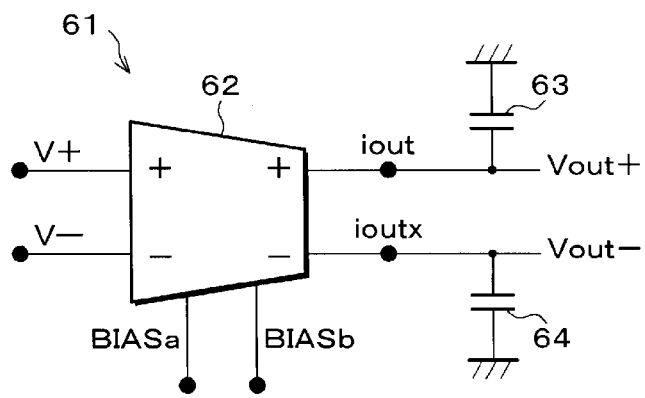
FIG. 2(a) and FIG. 2(b) are circuit block diagrams showing more specific structures of a low-pass filter capable of varying a cut-off frequency in the filter-provided device of FIG. 1.
Figure 2:
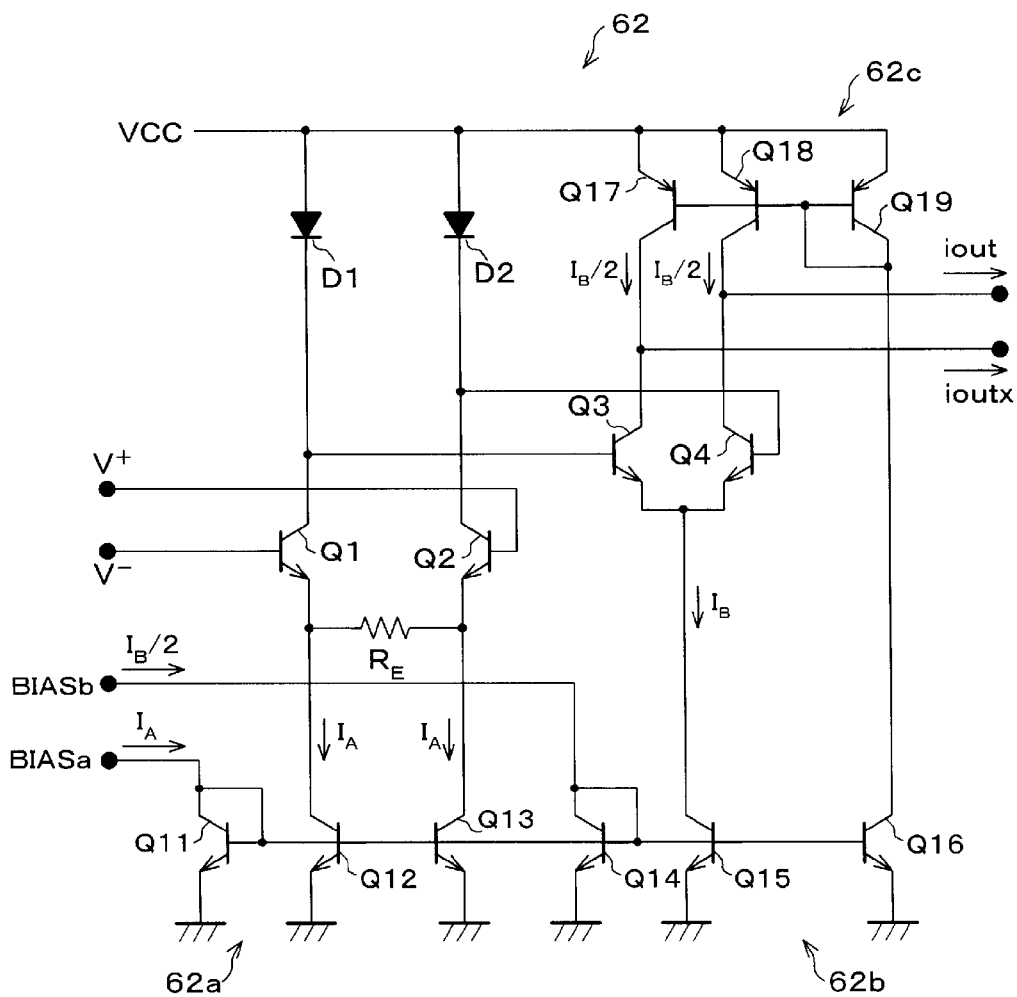

FIG. 1 shows a structure of a high-frequency receiving device 51 as the filter-provided device according to the present embodiment. The high-frequency receiving device 51 of FIG. 1 includes a receiving terminal 1, amplifying circuits 2 and 3, frequency converting circuits 4 and 5, a phase circuit 6, a local oscillating circuit 7, a PLL circuit 8, low-pass filters 10 and 11, AGC amplifiers 12 and 13, low-pass filters 14 and 15, amplifying circuits 16 and 17, A/D converters 18 and 19, a demodulating circuit 20, a local oscillating circuit 21, a PLL circuit 22, a common reference signal oscillator 25, a constant current source 26, and a controlling circuit 40.

In the high-frequency receiving device 51, when a high-frequency signal which is subject to digital modulation is inputted to the receiving terminal 1, the amplifying circuit 2 amplifies the input signal, and further, the amplifying circuit 3 amplifies an output signal of the amplifying circuit 2 at a controlled gain. Next, an output signal of the amplifying circuit 3 is inputted to the frequency converting circuits 4 and 5, and the frequency converting circuits 4 and 5 mix the signal inputted from the amplifying circuit 3 and a signal inputted from the phase circuit 6, and outputs a base band signal.

Further, the PLL circuit 8 to which a controlling signal T1 for determining a dividing ratio is inputted controls a phase of a local oscillating signal generated in the local oscillating circuit 7, that is, a phase of the local oscillating signal whose frequency is almost equal to a center frequency of a received frequency, based on a reference frequency signal generated in the common reference signal oscillator 25, and the local oscillating signal of the local oscillating circuit 7 is inputted to the phase circuit 6. The phase circuit 6 generates a signal whose phase is shifted 90° from the local oscillating signal, and the local oscillating signal of the original phase is inputted to one of the frequency converting circuits 4 and 5, and the signal whose phase is shifted 90° is inputted to the other.

Output Signals of the frequency converting circuits 4 and 5 are inputted to the low-pass filters 10 and 11 respectively, and the low pas filters 10 and 11 remove a high-frequency component of the input signal. Output signals of the low-pass filters 10 and 11 are inputted to the AGC amplifiers 12 and 13 respectively, and the AGC amplifiers 12 and 13 amplify the inputted signal at a controlled gain. output signals of the AGC amplifiers 12 and 13 are inputted to the low-pass filters 14 and 15, and the low-pass filters 14 and 15 remove interfering signals of adjacent channels and noise at the cut-off frequency controlled by the constant current source 26 described later. Output signals of the low-pass filters 14 and 15 are amplified by the amplifying circuits 16 and 17 respectively. Thereafter, the output signals are inputted to the A/D converters 18 and 19. The A/D converters 18 and 19 convert analog signals of the amplifying circuits 16 and 17 to digital signals so that the demodulating circuit 20 described later performs a demodulating process. Output signals of the A/D converters 18 and 19 are inputted to the demodulating circuit 20, and the demodulating circuit 20 demodulates the input signals which are subject to digital modulation, and outputs a transport signal TS.

Further, the PLL circuit 22 to which a controlling signal T2 for determining a dividing ratio is inputted controls a phase of the oscillating signal of a predetermined frequency generated in the local oscillating circuit 21, based on a reference frequency signal generated in the common reference signal oscillator 25, and the local oscillating signal whose phase is controlled is inputted to the A/D converters 18 and 19 and the demodulating circuit 20. The A/D converters 18 and 19 and the demodulating circuit 20 operates based on the local oscillating signal as an operating signal. The operating signal becomes a sampling clock signal with respect to the A/D converters 18 and 19.

Figure 5:
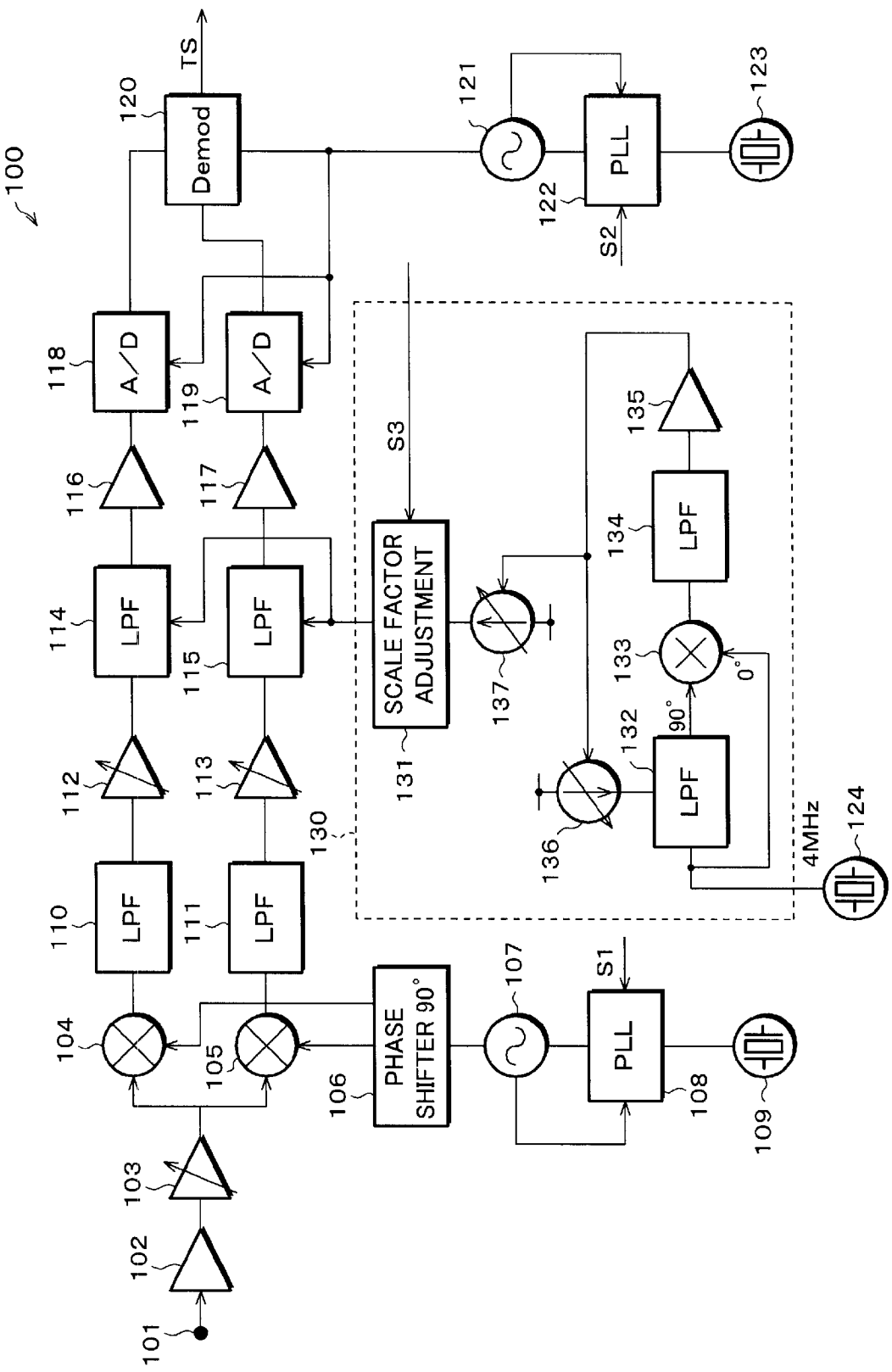
FIG. 5 is a circuit block diagram showing a structure of a conventional filter-provided device.

Here, in the present embodiment, unlike a high-frequency receiving device 100 of a prior art shown in FIG. 5, instead of reference signal oscillators 109 and 123, the common reference signal oscillator 25 is provided as a reference signal oscillator which generates a reference frequency signal which functions as the first reference frequency signal generated by the reference signal oscillator 123 and as the second reference frequency signal generated by the reference signal oscillator 109.

The low-pass filters 14 and 15 are filters which remove interfering signals of adjacent channels etc. and noise, and function as an anti-aliasing of the A/D converters 18 and 19. The input signal has a modulating rate of several megabaud to dozens of megabaud. Thus, in order to make the low-pass filters 14 and 15 function effectively, it is required to set the cut-off frequency not to a fixed value, but to a suitable value according to a baud-rate of the input signal. Further, if a cut-off frequency setting circuit is made up of a resistance and a capacitor in a circuit in an IC, a variation of an IC process brings about a variation of the cut-off frequency of ±15% to ±20%.

Further, like the high-frequency receiving device 100 in the prior art shown in FIG. 5, even though it is arranged so that the cut-off frequencies of the low-pass filters 114 and 115 are set by the current supplied to the low-pass filters 114 and 115, in a structure in which the controlling circuit 131 is provided in the following stage of the constant current source 137 whose output current value is fixed and the scale factor of the output current value is adjusted according to the controlling signal S3, a variation of an element characteristic and a current amplification factor hFE cause a large error between a current value and the target value.

On the other hand, in the high-frequency receiving device 51 according to the present embodiment, as shown in FIG. 1, members 42 to 46 which are subject to a loop back control so as to set the output current value of the constant current source 26 receive a signal whose frequency is varied according to the cut-off frequency as the constant current reference signal, and adjust the output current value of the constant current source 26 according to the constant current reference signal. Thus, it is possible to convert a frequency of the constant current reference signal to an output current amount of the constant current source 26 so accurately, and the output current of the constant current source 26 is applied directly to the low-pass filters 14 and 15 without passing via a circuit for adjusting the scale factor. As a result, the current which is inputted to the low-pass filters 14 and 15 is set so accurately so as to set the cut-off frequency.

Especially, in the present embodiment, an output current of the constant current source 26 is controlled by the master slave system as described later. Thus, even though there is a variation in a circuit element of the constant current source 26, an error of the output current brought about by the variation is solved as long as inclination of the variation is the same as a variation of a circuit element of a constant current source 46. Therefore, it is possible to perform frequency to current conversion so accurately, and it is possible to set a current value inputted to the low-pass filters 14 and 15 so accurately.

Here, FIG. 2(a) shows a circuit block diagram of a gm•C filter 61 making up the low-pass filters 14 and 15, and FIG. 2(b) shows a circuit-structure example of a gm amplifier 62 used in the gm•C filter 61 of FIG. 2(a). The gm•C filter 61 of FIG. 2(a) is an active filter including the gm amplifier 62 and capacitors 63 and 64. The gm amplifier 62 includes input terminals V+ and V−, output terminals iout and ioutx, and controlling terminals BIASa and BIASb. Two output signals of the low-pass filter 14, or two output signals of the low-pass filter 15 is inputted to the input terminals V+ and V− respectively. Further, the gm amplifier 62 outputs currents according to a potential difference Δv of the input terminals V+ and V− from the output terminals iout and ioutx. A current IA of a circuit (not shown) is inputted to the controlling terminal BIASa, and a current IB/2 outputted from a controlling circuit 40 described later is inputted to the controlling terminal BIASb. Further, the capacitor 63 is connected between the output terminal i out and a GND, and the capacitor 64 is connected between the output terminal ioutx and a GND. A terminal on the side of the output terminal iout of the capacitor 63 is one output terminal Vout+ of the gm•C filter 61, and a terminal on the side of the output terminal ioutx of the capacitor 64 is the other output terminal Vout− of the gm•C filter 61.

In the gm amplifier 62, as shown in FIG. 2(b), a voltage inputted to the input terminal V− is applied to a base of an NPN-type transistor Q1. A collector of the transistor Q1 is connected to a cathode of a diode D1 in which a power voltage VCC is applied to an anode. A voltage inputted to the input terminal V+ is applied to a base of an NPN-type transistor Q2. A collector of the transistor Q2 is connected to a cathode of a diode D2 in which a power voltage VCC is applied to an anode. An input resistor RE is connected between both emitters of the transistors Q1 and Q2. Further, a current mirror circuit 62a which applies the same current as the current IA inputted to the controlling terminal BIASa is provided between a junction of the both emitters and the input resistor RE and a GND.

The current mirror circuit 62a includes the NPN-type transistors Q11, Q12, and Q13. A collector of the transistor Q11 is connected to the controlling terminal BIASa, and an emitter of the transistor Q11 is connected to a GND. A collector of the transistor Q12 is connected to the junction of the emitter of the transistor Q1 and the input resistor RE, and an emitter of the transistor Q12 is connected to a GND. A collector of the transistor Q13 is connected to the junction of the emitter of the transistor Q2 and the input resistor RE, and an emitter of the transistor Q12 is connected to a GND. Further, respective bases of the transistors Q11, Q12, and Q13 are connected to each other, and the bases are connected to the collector of the transistor Q11. By the current mirror circuit 62a, a constant current source which applies the current IA between the junction of the emitter of the transistor Q1 and the input resistor RE and the GND is arranged, and a constant current source which applies the current IA between the junction of the emitter of the transistor Q2 and the input resistor RE and the GND is arranged.

Further, the collector of the transistor Q1 is connected to a base of an NPN-type transistor Q3, and the collector of the transistor Q2 is connected to a base of an NPN-type transistor Q4. The emitter of the transistor Q3 and the emitter of the transistor Q4 are connected to each other. Further, a current mirror circuit 62b which applies a current IB, twice as the current IB/2 inputted to the controlling terminal BIASb, to the path is provided between the both emitters and the GND.

The current mirror circuit 62b includes NPN-type transistors Q14, Q15, and Q16. A collector of the transistor Q14 is connected to the controlling terminal BIASb, and an emitter of the transistor Q14 is connected to a GND. A collector of the transistor Q15 is connected to the both emitters of the transistors Q3 and Q4, and an emitter of the transistor Q15 is connected to a GND. A collector of the transistor Q16 is connected to a collector of a transistor Q19 described later, and an emitter of the transistor Q16 is connected to a GND. Further, respective bases of the transistors Q13, Q14, and Q15 are connected to each other, and the bases are connected to the collector of the transistor Q14. By the current mirror circuit 62b, a constant current source which applies the current IB between a junction of the both emitters of the transistors Q3 and Q4 and the GND is arranged.

Further, the collector of the transistor Q4 is the output terminal iout, and the collector of the transistor Q3 is the output terminal ioutx. A current mirror circuit 62c which applies the current IB between the output terminals iout and ioutx and a line of the power voltage VCC is provided. The current mirror circuit 62c includes PNP-type transistors Q17, Q18, and Q19. A collector of the transistor Q17 is connected to the output terminal ioutx, and an emitter of the transistor Q17 is connected to the line of the power voltage VCC. A collector of the transistor Q18 is connected to the output terminal iout, and an emitter of the transistor Q18 is connected to the line of the power voltage VCC. A collector of the transistor Q19 is connected to the collector of the transistor Q16 described above, and an emitter of the transistor Q19 is connected to the line of the power voltage VCC. Further, respective bases of the transistors Q17, Q18, and Q19 are connected to each other, and the bases are connected to the collector of the transistor Q19. By the current mirror circuit 62c, a constant current source which applies the currents IB/2 between the line of the power voltage VCC and the output terminals iout and ioutx is provided.

Note that, a constant current source which applies the current IA in the gm amplifier may be arranged without the controlling terminal BIASa to which a signal is not inputted from the controlling circuit 40.

In the gm amplifier 62 arranged in the foregoing manner, when a transconductance is gm, and a resistance value of the input resistor RE is RE, the following relation exists between the potential difference ΔVin of the input terminals V+ and V− and currents Iout outputted from the output terminals iout and ioutx.

$$I_{out}=gm \cdot \Delta V_{in} \quad (1)$$

$$gm=I_B/(2I_A R_E) \quad (2)$$

As shown by the expression (2), the gm is varied based on the ratio of IA to IB. In the gm•C filter 61 arranged by connecting the capacitors 63 and 64 to the gm amplifier 62, a cut-off frequency of indicative of a passing frequency characteristic of the low-pass filters 14 and 15 is expressed as follows with capacitance of the capacitors 63 and 64 expressed as C.

$$f_0=1/\{2\pi C (1/gm)\} \quad (3)$$

As shown by the expressions (2) and (3), it is possible to vary the cut-off frequency $f_0$ of the low-pass filters 14 and 15 by varying the gm by a controlling signal of outside such as the IA and the IB. In this way, the low-pass filters 14 and 15 function as "filters in which a frequency value indicative of a passing frequency characteristic is set according to a value of a current inputted as a controlling signal".

Next, a structure of the controlling circuit 40, and how the controlling circuit 40 controls the cut-off frequency $f_0$ are described. As shown in FIG. 1, the controlling circuit 40 includes a frequency dividing circuit 41, a phase shift circuit 42, a mixer 43, a low-pass filter 44, a DC amplification circuit 45, a constant current source 46, and a controlling signal generator 47.

The frequency dividing circuit 41 divides (1/N dividing) a local oscillating signal of a predetermined frequency generated in the local oscillating circuit 21, that is, the sampling clock signal of the A/D converters 18 and 19, and generates a constant current reference signal whose frequency is equal to the cut-off frequency of the low-pass filters 14 and 15 which is to be set. The constant current reference signal is "a constant current reference signal which includes information of a frequency value indicative of a passing frequency characteristic". Further, the controlling signal generator 47 generates a controlling signal T1 for determining the dividing ratio of the sampling clock signal, and inputs the controlling signal T1 to the frequency dividing circuit 41. The controlling signal generator 47 further generates a controlling signal T2 for determining the dividing ratio in the PLL circuit 22 according to a baud-rate of the input signal, and inputs the controlling signal T2 to the PLL circuit 22. In the PLL circuit 22, the first reference frequency signal inputted from the reference signal oscillator 25 is a reference frequency signal on which PLL control is based.

In this way, the A/D converters 18 and 19 function as "an analog to digital converting section which converts an analog signal to a digital signal", and the local oscillating circuit 21, the PLL circuit 22, the reference signal oscillator 25, and the controlling signal generator 47 make up "a sampling clock signal generating section which generates a sampling clock signal of the analog to digital converting section". Further, the frequency dividing circuit 41 and the controlling signal generator 47 make up "a frequency converting section which generates a constant current reference signal whose frequency is equal to a frequency value indicative of a passing frequency characteristic which is to be set based on the sampling clock signal". Further, the controlling signal T1 is "a frequency converting controlling signal which is inputted to the frequency converting section so as to control a converted frequency of the constant current reference signal", and the controlling signal T2 is "a sampling frequency controlling signal which is inputted to the sampling clock signal generating section so as to control a frequency of the sampling clock signal".

The phase shift circuit 42 uses the same type gm•C filter 61 as the low-pass filters 14 and 15, and is a low-pass filter which functions as a master of the master slave system. In the phase shift circuit 42, a phase of the constant current reference signal outputted from the frequency dividing circuit 41 is shifted 90°. In the constant current reference signal which is to be inputted, when an amplitude is expressed as A, and an angular frequency is expressed as ω, a fluctuation of an angular frequency ω is expressed as ωm, and time is expressed as t, the following relation exists between them.

$$Vin = A\cos(\omega + \omega m)t \quad (4)$$

Then, the phase shift circuit 42 outputs, $$V_{\text{sift}} = A\cos\{(\omega + \omega m)t + \pi/2 - \alpha\omega m\} \quad (5)$$

Figure 3:
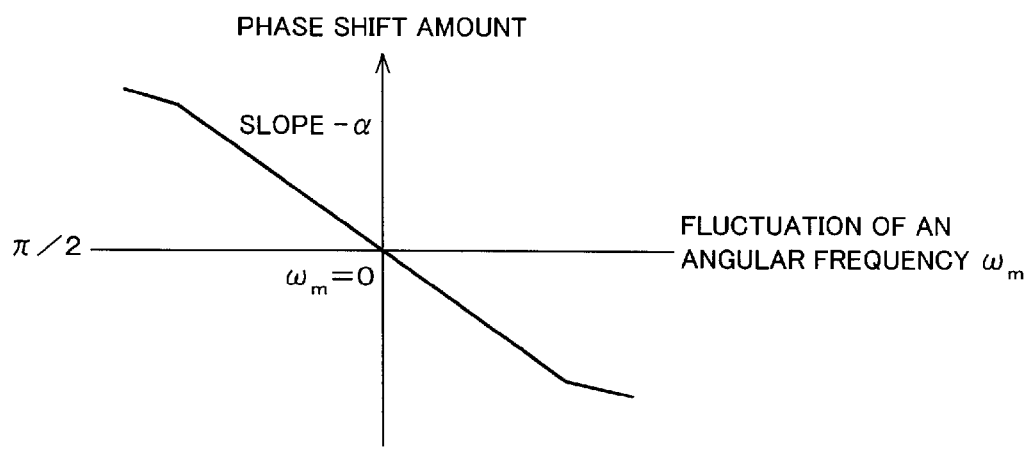
FIG. 3 is a graph showing a characteristic of a phase shift circuit of a controlling circuit in the filter-provided device of FIG. 1.

Here, $\pi/2 - \alpha\omega m$ is a phase shift amount, and a relation of ωm and the phase shift amount is shown as FIG. 3. α is slope of a straight portion of a line which passes through a point of αm=0, a phase shift amount =π/2.

The mixer 43 performs a multiplication of the output signal Vsift of the phase shift circuit 42 and the constant current reference signal Vin, and performs frequency conversion. In this case, an output signal MIXout of the mixer 43 becomes as follows.

$$\begin{aligned} MIXout &= B \cdot Vin \cdot Vsift \quad (6) \\ &= B \cdot A^2 \cdot \cos(\omega + \omega_m)t \times \\ &\quad \cos\{(\omega + \omega_m)t + \pi/2 - \alpha\omega_m\} \\ &= 1/2 \cdot B \cdot A^2 [\cos\{2(\omega + \omega_m)t + \pi/2 - \alpha\omega_m\} + \\ &\quad \cos(\pi/2 - \alpha\omega_m)] \\ &= 1/2 \cdot B \cdot A^2 [-\sin\{2(\omega + \omega_m)t - \alpha\omega_m\} + \sin(\alpha\omega_m)] \end{aligned}$$

Figure 4:
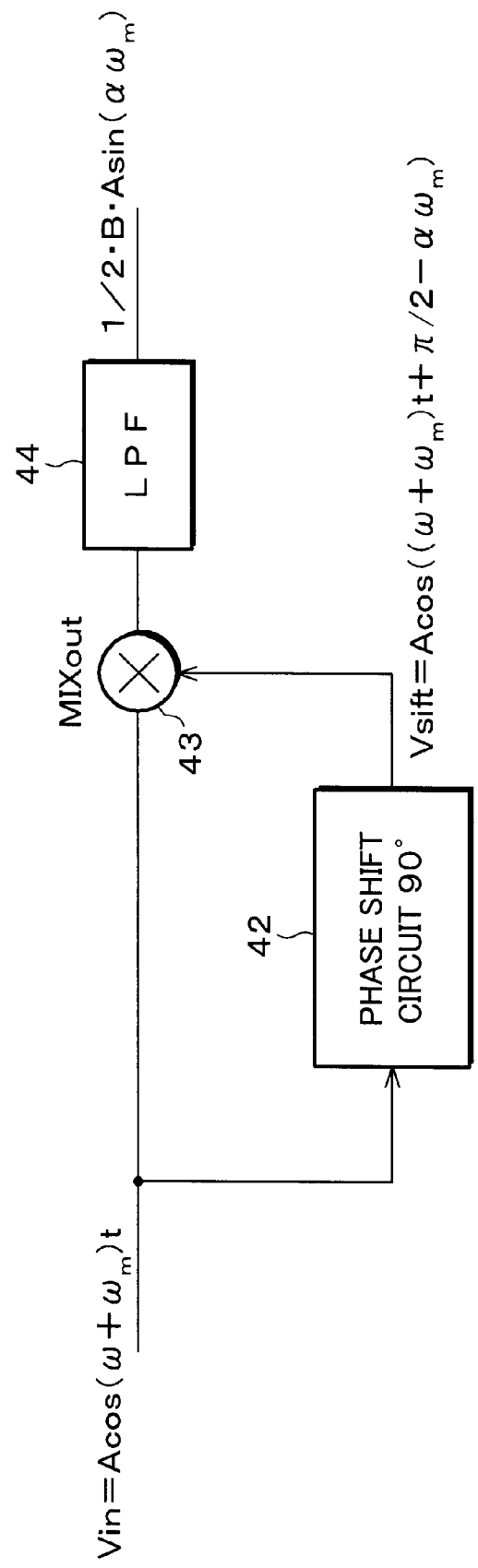
FIG. 4 is a circuit block diagram for describing a signal in a phase comparing circuit of the controlling circuit in the filter-provided device of FIG. 1.

The output signal MIXout passes through the low-pass filter 44, so that 2(ω+ωm) component is removed, and the output signal of the low-pass filter 44 becomes 1/2•B•A² sin (αωm). In this way, the phase shift circuit 42, the mixer 43, and the low-pass filter 44 make up a phase comparing circuit. FIG. 4 shows signals of respective portions in the phase comparing circuit. The output signal of the low-pass filter 44 is inputted via the DC amplifying circuit 45 to the constant current sources 26 and 46. The constant current source 46 supplies a constant current according to the output signal of the DC amplifying circuit 45 to the phase shift circuit 42. By this, loop back control is performed so that MIXout=0. In this way, the constant current source 26 outputs a constant current according to the constant current reference signal, that is, outputs a current according to the cut-off frequency of the low-pass filters 14 and 15 which is to be set. The constant current source 26 does not include a switch circuit such as the controlling circuit 131 described in the prior art in which a large number of current mirror circuits and MOS-FETs are used. That is, the constant current source 26 generates directly and outputs a constant current according to respective cut-off frequencies of the low-pass filters 14 and 15 to be set, based on the constant current reference signal inputted to the controlling circuit 40. In the constant current source 26, after a constant current which is. common with respect to the cut-off frequencies is generated, a scale factor adjustment such as a variable multiplication and an equal multiplication is not performed. The constant current is inputted to the controlling terminal BIASb of the low-pass filters 14 and 15, and a target cut-off frequency is set in the low-pass filters 14 and 15 on the side of the slave.

In this way, the constant current source 26 functions as "a constant current source which inputs a current according to a frequency value indicative of a passing frequency characteristic to a filter", and the controlling circuit 40 functions as "a constant current source controlling section which controls the constant current source so as to output a current according to a frequency value indicative of a passing frequency characteristic set by the constant current source". Thus, the high-frequency receiving device 51 according to the present embodiment is an example of a filter-provided device with a filter in which a frequency value indicative of a passing frequency characteristic is set according to a value of a current inputted as a controlling signal, includes a constant current source for inputting the current to the filter; and a constant current source controlling section for controlling the constant current source so as to output the current according to a frequency value indicative of a passing frequency characteristic set by the constant current source.

According to the filter-provided device (high-frequency receiving device 51), a constant current source controlling section (controlling circuit 40) controls a constant current source (constant current source 26) so as to output a current whose value corresponds to a frequency value (cut-off frequency of a low-pass filter etc.) indicative of a passing frequency characteristic which is to be set. A current outputted from the constant current source (constant current source 26) without performing scale factor adjustment is inputted directly to a filter (low-pass filters 14 and 15), and a frequency value (cut-off frequency) indicative of a passing frequency characteristic of the filter (low-pass filters 14 and 15) is set to a desired value. A scale factor adjustment of a current value outputted from the constant current source (constant current source 26) is not performed, so that it is not required to provide a switch circuit for performing the scale factor adjustment. Thus, it is possible to suppress an error of the current value inputted to the filter (low-pass filters 14 and 15).

As a result, it is possible to provide the filter-provided device in which a frequency value (cut-off frequency) indicative of a passing characteristic of the filter can be set so accurately.

Further, the high-frequency receiving device 51 is an example of the filter-provided device having the following characteristic besides the foregoing characteristics. In a case where the filter-provided device includes an analog to digital converting section (18 and 19) for converting an analog signal to a digital signal, and a sampling clock signal generating section (PLL circuit 22) for generating a sampling clock signal of the analog to digital converting section, the constant current source controlling section generates a constant current reference signal which includes information of a frequency value indicative of the passing frequency characteristic based on the sampling clock signal, and controls the constant current source based on the constant current reference signal.

According to the filter-provided device, the constant current source controlling section (controlling circuit 40) generates a constant current reference signal which includes a frequency value (cut-off frequency) indicative of a passing frequency characteristic based on the sampling signal generated in the existing sampling clock signal generating section (made up of the local oscillating circuit 21, the PLL circuit 22, the reference signal oscillator 25, and the controlling signal generator 47), and controls the constant current source (constant current source 26) based on the generated constant current reference signal. Thus, it is possible to provide a filter-provided device in which a frequency value (cut-off frequency) indicative of a passing frequency characteristic can be set so accurately, and power consumption can be reduced by a simple structure. Further, in a case where a signal processed by the filter (low-pass filters 14 and 15) is a small signal of a modulating rate, and the signal is converted from an analog signal to a digital signal by the analog to digital converting section (A/D converters 18 and 19) like the high-frequency receiving device 51, it is possible to reduce a frequency of the sampling clock signal. Thus, it is possible to reduce power consumption due to the reduction of the frequency.

Further, the high-frequency receiving device 51 is an example of the filter-provided device having the following characteristic besides the foregoing characteristics. In the filter-provided device, the constant current source controlling section includes a frequency converting section (frequency dividing circuit 41) which generates a constant current reference signal whose frequency is equal to a frequency value indicative of the passing frequency characteristic to be set, based on the sampling clock signal.

According to the filter-provided device, the constant current source controlling section (controlling circuit 40) generates a constant current reference signal whose frequency is equal to a frequency value (cut-off frequency) indicative of a passing frequency characteristic set in the filter, based on the sampling clock signal of the analog to digital converting section (A/D converters 18 and 19), so that information of the frequency value (cut-off frequency) indicative of the passing frequency characteristic is included. Based on this, the constant current source (constant current source 26) is controlled so that a current according to the frequency value (cut-off frequency) indicative of the passing frequency characteristic set by the constant current source (constant current source 26) is outputted. Thus, it is possible to easily vary a current of the constant current source (constant current source 26) according to a frequency value (cut-off frequency) indicative of a passing frequency characteristic which is to be set.

Further, the high-frequency receiving device 51 is an example of the filter-provided device which has the following characteristic besides the foregoing characteristics. In the filter-provided device, the frequency converting section includes a frequency dividing circuit which generates the constant current reference signal.

According to the filter-provided device, since the frequency dividing circuit (frequency dividing circuit 41) is used, it is possible to easily arrange the frequency converting section when a frequency of the sampling clock signal is higher than the frequency value (cut-off frequency) indicative of the passing frequency characteristic.

Further, high-frequency receiving circuit 51 may be arranged so that the controlling signal T1 which is outputted from the controlling signal generator 47 shown in FIG. 1 to the frequency dividing circuit 41 and the controlling signal T2 which is outputted to the PLL circuit 22 are transmitted by a common bus such as an IIC bus (Inter Integrated Circuit). The high-frequency receiving device 51 arranged in this way is an example of the filter-provided device having the following characteristic besides the foregoing characteristics. In the filter-provided device, a frequency converting controlling signal which is inputted to the frequency converting section so as to control a converted frequency of the constant current reference signal and a sampling frequency controlling signal which is inputted to the sampling clock signal generating section so as to control a frequency of the sampling clock signal are transmitted by a common bus.

According to the filter-provided device, since the frequency converting controlling signal (controlling signal T1) and the sampling frequency controlling signal (controlling signal T2) are transmitted by the common, bus, it is possible to control a converted frequency of the constant current reference signal, and to simplify a structure which controls the frequency of the sampling clock signal.

Further, in the high-frequency receiving device 51, as shown in FIG. 1, the controlling signal generator 47 generates the controlling signal T3 for determining the dividing ratio of the PLL circuit 8, and inputs the dividing ratio to the PLL circuit 8. Thus, in this case, the controlling signal T3 may be transmitted by the common bus by which the controlling signals Ti and T2 are transmitted. The PLL circuit 8 controls a phase of the local oscillating signal of the local oscillating circuit 7, according to the controlling signal T3, based on the second reference frequency signal (same as the first reference frequency signal) outputted from the common reference signal oscillator 25. By this, the local oscillating signal becomes a local oscillating signal for dividing a spectrum in a frequency domain of the multiplied signal into a low range and a high range so as to take a base band signal, that is, generates a spectrum dividing signal, by performing multiplication of the local oscillating signal and the received signal which was amplified in the frequency converting circuits 4 and 5. Thus, the local oscillating circuit 7, the PLL circuit 8, the common reference signal oscillator 25, and the controlling signal generator 47 make up "a spectrum dividing section which generates the spectrum dividing signal used to generate the spectrum divided in the frequency domain based on the modulated high-frequency signal". Further, the controlling signal T3 is "a spectrum dividing controlling signal which is inputted to the spectrum dividing section so as to control the frequency of the spectrum dividing signal".

The high-frequency receiving device 51 arranged in this way is an example of the filter-provided device having the following characteristic besides the foregoing characteristics. In the filter-provided device which processes the modulated high-frequency signal, in the case where the filter-provided device includes the spectrum dividing section which generates the spectrum dividing signal used to generate the spectrum divided in the frequency domain, a spectrum dividing controlling signal which is inputted to the spectrum dividing section so as to control the frequency of the spectrum dividing signal is transmitted by the bus.

According to the filter-provided device, since the spectrum dividing controlling signal (controlling signal T3) is transmitted with the frequency converting controlling signal (controlling signal T1) and the sampling frequency controlling signal (controlling signal T2) by the common bus, it is possible to simplify a structure which performs control including control of the frequency of the spectrum dividing signal used to divide the spectrum in the frequency domain of the high-frequency signal.

Further, since the high-frequency receiving device 51 includes the common reference signal oscillator 25, the high-frequency receiving device 51 which is an example of the filter-provided device has the following characteristic besides the foregoing characteristics. In the filter-provided device which processes the modulated high-frequency signal, the spectrum dividing section which generates the spectrum dividing signal used to generate the spectrum divided in the frequency domain based on the modulated high-frequency signal is provided, and the sampling clock signal generating section generates the sampling clock signal by PLL control based on the first reference frequency signal of a predetermined frequency, and in the case where the spectrum dividing section generates the spectrum dividing signal by the PLL control based on the second reference frequency signal of a predetermined frequency, the common reference signal oscillator (25) which generates a reference frequency signal functioning as the first reference frequency signal and the second reference frequency signal is provided.

According to the filter-provided device, the first reference frequency signal used to generate the sampling clock signal by the PLL control and the second reference frequency signal used to generate the spectrum dividing signal by the PLL control are supplied as the same reference frequency signal from the common reference signal oscillator (common reference signal oscillator 25), so that it is possible to simplify the structure, and to reduce cost.

Note that, in the present embodiment, although the current $I_B$ (that is, $I_B/2$) is varied so as to control the cut-off frequency of based on the expressions (2) and (3), the filter-provided device may be arranged so that a current of the constant current source 26 is inputted as the current $I_A$ to the low-pass filters 14 and 15, and the current $I_A$ is varied so as to control the cut-off frequency $f_0$, as apparent from the expressions. Further, the filter-provided device may be arranged so that two constant current sources are further provided, and the constant currents are inputted as currents $I_A$ and $I_B$ to the low-pass filters 14 and 15, and both the currents $I_A$ and $I_B$ are varied so as to control the cut-off frequency $f_0$.

Further, although the structure in which the cut-off frequency of the low-pass filter is controlled is described above, other than this, it is possible to exactly control the cut-off frequency of a high-pass filter which is a frequency value indicative of a passing frequency characteristic of a filter, and a center frequency of a pass band of a band pass filter, as in the cut-off frequency of the low-pass filter.

However, in a case where filter (14 and/or 15) is low-pass filter which restricts a frequency band of an analog signal which is inputted to analog digital converter (18 and/or 19), it is required that the low-pass filter removes at least a frequency component of not more than ½ of the sampling frequency so as to remove a converting noise of the analog digital converter. Thus, the sampling frequency is set to be higher than the cut-off frequency, for example, the frequency which is three times as high as the cut-off frequency is set. As a result, in a simple circuit such as the frequency dividing circuit 41, it is possible to generate the constant current reference signal whose frequency is equal to the cut-off frequency based on the sampling frequency. Note that, when the frequency of the sampling clock is varied and the ratio of the sampling frequency and the cut-off frequency is not varied, the dividing ratio of the frequency dividing circuit 41 may be fixed and the controlling signal T1 given to the frequency dividing circuit 41 may be omitted.

Further, the filter-provided device is not restricted to the high-frequency receiving device, but can be applied to any device such as a transmitter, a receiver, etc. which includes a filter whose frequency value indicative of a passing frequency characteristic is set based on a current.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A filter-provided device comprising:
 a filter in which a frequency value indicative of a passing characteristic is set according to a value of a current inputted as a controlling signal;
 a constant current source for inputting the current to the filter; and
 a constant current controlling section for controlling the constant current source so as to output the current according to the frequency value indicative of the passing frequency characteristic which is set by the constant current source.

2. The filter-provided device set forth in claim 1 comprising:
 an analog to digital converting section for converting an analog signal to a digital signal; and
 a sampling clock signal generating section for generating a sampling clock signal of the analog to digital converting section,
 wherein the constant current source controlling section generates a constant current reference signal including information of the frequency value indicative of the passing frequency characteristic based on the sampling clock signal, so as to control the constant current source based on the constant current reference signal.

3. The filter-provided device set forth in claim 2, wherein the constant current controlling section includes a frequency converting section for generating the constant current reference signal whose frequency is equal to the frequency value indicative of the passing frequency characteristic which is set, based on the sampling clock signal.

4. The filter-provided device set forth in claim 3, wherein the frequency converting section includes a frequency divider for generating the constant current reference signal.

5. The filter-provided device set forth in claim 3, wherein (1) a frequency converting controlling signal which is inputted to the frequency converting section so as to control a converted frequency of the constant current reference signal and (2) a sampling frequency controlling signal for controlling the frequency of the sampling clock signal are transmitted by a common bus.

6. The filter-provided device set forth in claim 5, wherein:
 said filter-provided device processes a modulated high-frequency signal, and
 said filter-provided device includes a spectrum dividing signal generating section for generating a spectrum dividing signal used to generate a spectrum which is divided in a frequency domain based on the high-frequency signal, and
 a spectrum dividing controlling signal which is inputted to the spectrum dividing signal generating section so as to control the frequency of the spectrum dividing signal is transmitted by the bus.

7. The filter-provided device set forth in claim 2, wherein said filter-provided device processes a modulated high-frequency signal, and
 a spectrum dividing signal generating section for generating a spectrum dividing signal used to generate a spectrum divided in a frequency domain based on the high-frequency signal is provided, and
 the sampling clock signal generating section generates the sampling clock signal by PLL control based on a first reference frequency signal of a predetermined frequency, and
 the spectrum dividing signal generating section generates the spectrum dividing signal by PLL control based on a second reference frequency signal of a predetermined frequency, and
 said filter-provided device includes a common reference signal oscillator for generating a reference frequency signal which serves as the first reference frequency signal and the second reference frequency signal.

8. The filter-provided device set forth in claim 1, wherein said filter includes a transconductance amplifier whose transconductance is controlled by the current outputted from the constant current source.

9. The filter-provided device set forth in claim 2, wherein:
said filter is a low-pass filter for restricting a frequency band of the analog signal which is inputted to the analog to digital converting section, and
the frequency value indicative of the passing frequency characteristic is a cut-off frequency of the filter.

10. The filter-provided device set forth in claim 3, wherein said constant current source controlling section includes:
a master constant current source;
a master filter in which the constant current reference signal is inputted and the passing frequency characteristic is controlled according to a value of a constant current outputted by the master constant current source;
a master mixer for mixing an output signal of the master filter and the constant current reference signal; and
a controlling section for performing loop back control of an output current value of the master constant current source so that the output signal of the master mixer becomes 0, and controlling the output current value of the constant current source as a slave according to output current value control of the master constant current source.

11. A filter-provided device comprising:
a constant current reference signal generating section for varying a frequency of a constant current reference signal according to a frequency value indicative of a passing frequency characteristic to be set,
a constant current generating section for performing frequency to current conversion so as to output a constant current of a value according to a frequency of the constant current reference signal; and
a filter whose passing frequency characteristic is controlled according to a value of the constant current.

12. The filter-provided device set forth in claim 11, wherein said constant current reference signal generating section includes a frequency dividing circuit whose dividing ratio is set according to the frequency value.

13. The filter-provided device set forth in claim 11, wherein said filter includes a transconductance amplifier whose transconductance is controlled by a value of the constant current.

14. The filter-provided device set forth in claim 13, wherein said constant current generating section supplies the constant current directly to the transconductance amplifier.

15. The filter-provided device set forth in claim 11 comprising:
an analog to digital converter for converting an analog signal which passed through the filter to a digital signal, wherein:
said constant current reference signal generating section includes:
a sampling clock signal generating section for generating a sampling clock signal which indicates a sampling point of the analog to digital converter; and
a signal generating section for generating the constant current reference signal based on the sampling clock signal.

16. The filter-provided device set forth in claim 15, wherein a dividing ratio of said sampling clock signal generating section is varied according to the frequency value.

17. The filter-provided device set forth in claim 15, wherein:
said filter is a low-pass filter for restricting a frequency band of the analog signal, and
the frequency value indicative of the passing frequency characteristic is a cut-off frequency of the filter.

18. The filter-provided device set forth in claim 11, wherein said constant current generating section includes:
a slave constant current source for outputting a current to the filter;
a master constant current source;
a master filter in which the constant current reference signal is inputted, and passing frequency characteristic is controlled according to a value of a constant current outputted by the master constant current source;
a master mixer for mixing an output signal of the master filter and the constant current reference signal;
a controlling section for performing loop back control of an output current value of the master constant current source so that the output signal of the master mixer becomes 0, and controlling an output current value of the slave constant current source according to output current value control of the master constant current source.

19. The filter-provided device set forth in claim 15, wherein:
said filter-provided device processes a modulated high-frequency signal, and
said filter-provided device includes a spectrum dividing signal generating section for generating a spectrum dividing signal used to generate a spectrum which is divided in a frequency domain based on the high-frequency signal, and
the sampling clock signal generating section generates the sampling clock signal by PLL control based on a first reference frequency signal of a predetermined frequency, and
the spectrum dividing signal generating section generates the spectrum dividing signal by PLL control based on a second reference frequency signal of a predetermined frequency, and
said filter-provided device includes a common reference signal oscillator for generating a reference frequency signal which serves as the first reference frequency signal and the second reference frequency signal.

20. A method for setting a passing frequency characteristic of a filter which sets a frequency value indicative of the passing frequency characteristic according to a value of a current inputted as a controlling signal, said method comprising:
a constant current generating step for generating a constant current of a value according to a frequency of a constant current reference signal by frequency to current conversion of the constant current reference signal; and
a frequency varying step, which is carried out prior to said constant current generating step, for varying the frequency of the constant current reference signal according to the frequency value which should be set in the filter.

21. The method set forth in claim 20, comprising:
an analog to digital converting step for converting an analog signal which passed through the filter to a digital signal; and
a sampling frequency varying step for varying a sampling frequency in converting the analog signal to the digital signal in said analog to digital converting step,
wherein the frequency of said constant current reference signal is varied according to the sampling frequency.

* * * * *